United States Patent
Chen et al.

(10) Patent No.: US 6,580,228 B1
(45) Date of Patent: Jun. 17, 2003

(54) FLEXIBLE SUBSTRATE MOUNTED SOLID-STATE LIGHT SOURCES FOR USE IN LINE CURRENT LAMP SOCKETS

(75) Inventors: James C. Chen, Bellevue, WA (US); Darrin Huston, Enumclaw, WA (US); Brent Wiscombe, Mesa, AZ (US)

(73) Assignee: Light Sciences Corporation, Snoqualmie, WA (US)

( * ) Notice: Subject to any disclaimer, the term of this patent is extended or adjusted under 35 U.S.C. 154(b) by 34 days.

(21) Appl. No.: 09/644,253

(22) Filed: Aug. 22, 2000

(51) Int. Cl.⁷ .............................................. H05B 37/00
(52) U.S. Cl. ..................... 315/185 R; 315/192; 315/70; 362/800; 362/240
(58) Field of Search .......................... 315/185 R, 185 S, 315/192, 206, 276, 324, 294, 51, 70; 362/800, 294, 240

(56) References Cited

U.S. PATENT DOCUMENTS

| | | | |
|---|---|---|---|
| 3,795,830 A | | 3/1974 | Richardson .................. 307/311 |
| 4,211,955 A | * | 7/1980 | Ray ............................ 315/53 |
| 4,630,183 A | | 12/1986 | Fujita ......................... 362/311 |
| 4,727,289 A | | 2/1988 | Uchida ........................ 315/71 |
| 4,939,426 A | | 7/1990 | Menard et al. ............. 315/192 |
| 5,160,200 A | | 11/1992 | Cheselske ................... 362/249 |
| 5,304,534 A | * | 4/1994 | Ciszek ........................ 505/434 |
| 5,349,265 A | * | 9/1994 | Lemelson ................... 313/311 |
| 5,363,295 A | | 11/1994 | DeKleine et al. ........... 362/346 |
| 5,463,280 A | * | 10/1995 | Johnson ...................... 315/187 |
| 5,575,459 A | * | 11/1996 | Anderson ................... 362/240 |
| 5,726,535 A | * | 3/1998 | Yan ........................ 315/185 R |
| 5,766,234 A | | 6/1998 | Chen et al. .................. 607/92 |
| 5,800,478 A | | 9/1998 | Chen et al. .................. 607/88 |
| 5,890,794 A | * | 4/1999 | Abtahi et al. ............... 362/294 |

FOREIGN PATENT DOCUMENTS

| | | |
|---|---|---|
| AU | 717643 | 8/1998 |
| WO | WO 00/50809 | 8/2000 |

* cited by examiner

Primary Examiner—Haissa Philogene
(74) Attorney, Agent, or Firm—Ronald M. Anderson

(57) ABSTRACT

A lamp using solid-state light emitting sources is configured to be used in a conventional socket. The lamp includes a flexible substrate on which are mounted a plurality of light emitting sources, such as light emitting diodes (LEDs) in spaced-apart array. In one embodiment, a flexible substrate configured as a generally rectangular panel formed into a cylindrical shape includes a plurality of conductive traces to which the LEDs are connected both mechanically and electrically. The flexible substrate is then enclosed within a light transmissive translucent cover that is attached to a base in which is disposed a power supply. The base is shaped and configured to be threaded into a conventional incandescent light socket and includes a center terminal through which AC line power is supplied to the power supply. The power supply provides an appropriate voltage and current to energize the light sources so that they produce a white light that is emitted radially outward around a longitudinal axis of the lamp. In a different embodiment, the light sources are mounted on a flexible substrate formed as a strand or thread that is wound in a helix around a cylindrical support. The light sources are also provided on a flap that covers the end of the cylinder so that light is emitted through the top or end of the cover. Also included is a solid-state lamp adapted to work in a conventional three-way socket.

30 Claims, 5 Drawing Sheets

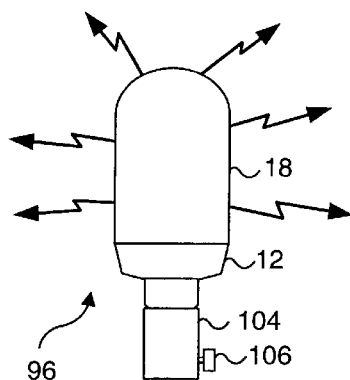
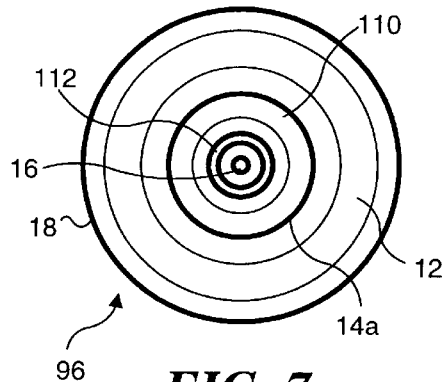
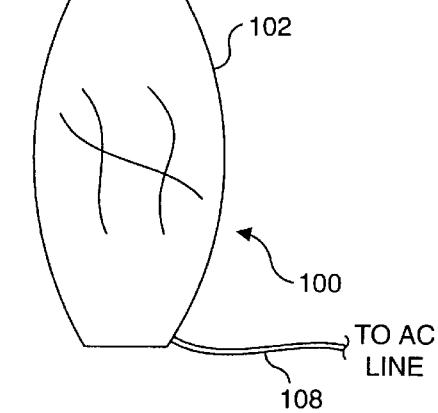
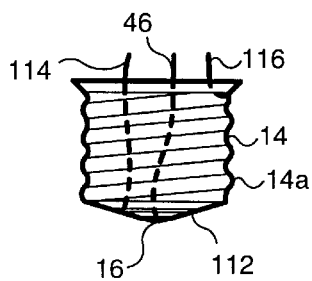
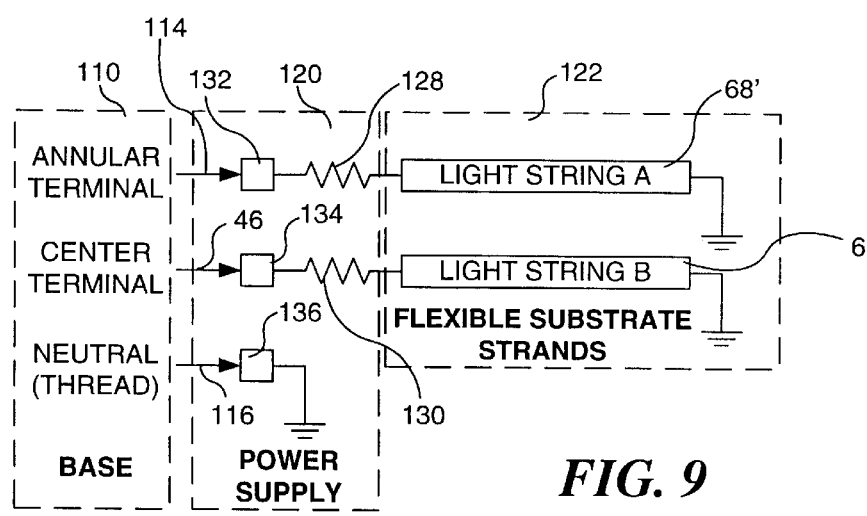
FIG. 6
FIG. 7
FIG. 8
FIG. 9

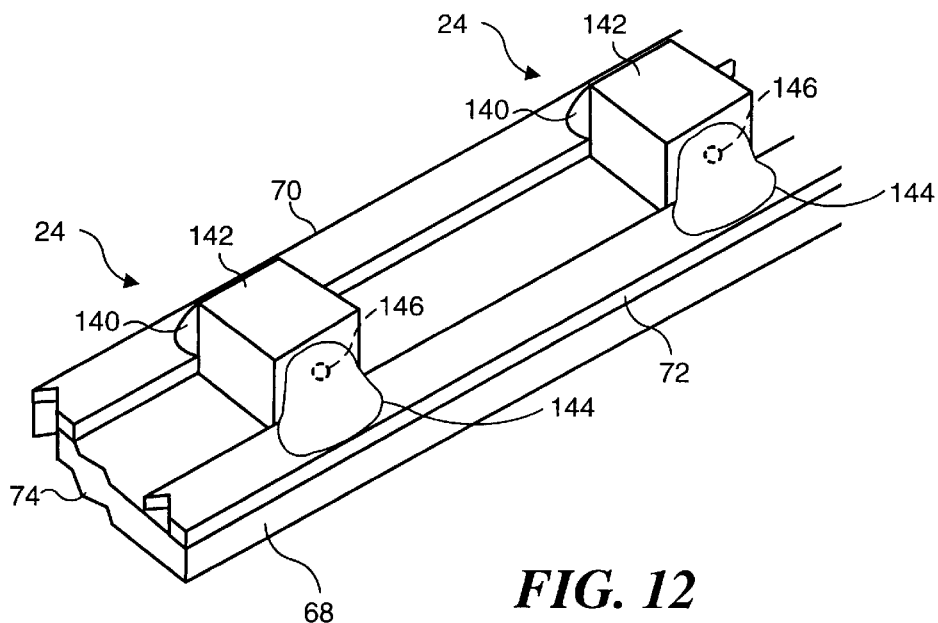
FIG. 12
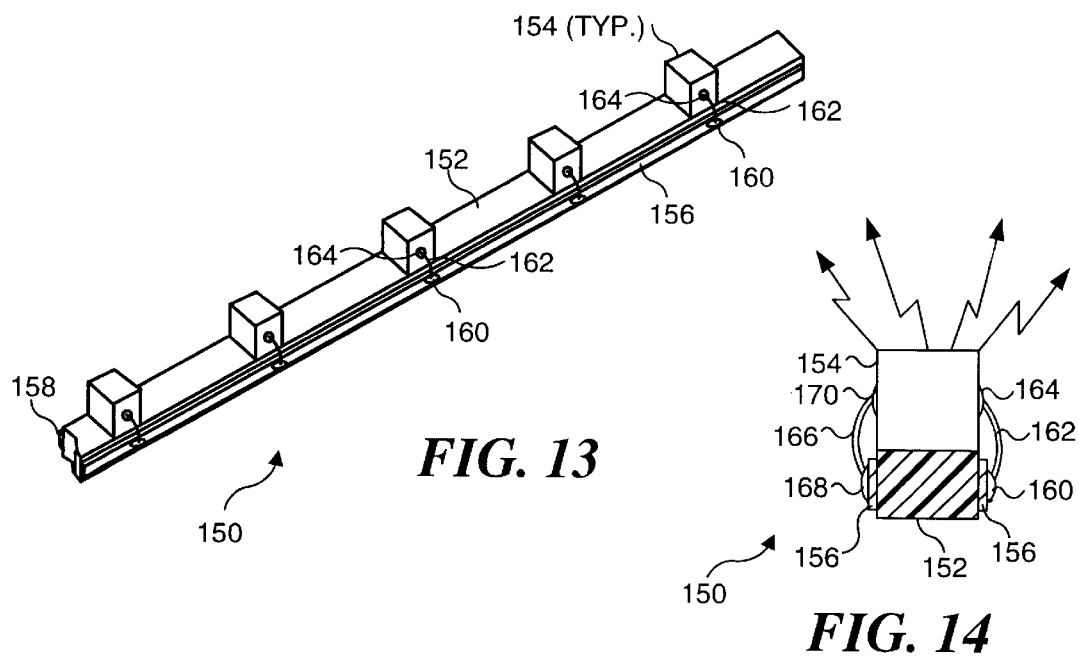
FIG. 13
FIG. 14

FLEXIBLE SUBSTRATE MOUNTED SOLID-STATE LIGHT SOURCES FOR USE IN LINE CURRENT LAMP SOCKETS

FIELD OF THE INVENTION

This invention generally pertains to a flexible substrate on which a plurality of light sources are mounted, and more specifically, to a plurality of solid-state light sources mounted on a flexible substrate for use in a lamp to provide room illumination.

BACKGROUND OF THE INVENTION

Incandescent bulbs are one of the least efficient light sources, yet they still comprise a substantial portion of the lighting used in homes and businesses. It has long been recognized that fluorescent lighting and halogen lamps produce light much more efficiently and last substantially longer, yet even in new construction, incandescent bulbs are often used instead of the more efficient alternative types of bulbs. One of the causes delaying the general acceptance and greater use of more efficient lighting has been the initial cost of non-incandescent lighting. Although the total cost of installation and the energy required for operating non-incandescent lighting systems is substantially less than incandescent lighting, the initial cost can be significant and often discourages the installation of alternative lighting fixtures. Moreover, home and business owners are often reluctant to replace an incandescent bulb fixture with a relatively expensive fluorescent lamp and ballast assembly or other alternative lighting fixture.

Recognizing that the cost and difficulty of replacing incandescent lighting fixtures has been a significant deterrent to the acceptance of alternative lighting in new installations and the replacement of incandescent lamps with alternative lighting systems, several different compact fluorescent lamp and ballast assemblies have been developed that include a conventional incandescent lamp threaded base and which are sized to retrofit incandescent lamps in conventional incandescent lamp sockets. By using such retrofit fluorescent lamps, the need to replace the incandescent lamp with a separate ballast and other components of the type normally required for a fluorescent lamp is avoided. Although retrofit fluorescent lamps are substantially more expensive than the incandescent bulbs they replace, the retrofit lamps have a much longer expected life and use much less electrical power to produce a light output equivalent to that of the incandescent bulb that they replace.

Unfortunately, many people are unwilling to pay the cost of a retrofit fluorescent lamp, even though they may recognize that these lamps will provide long-term savings. The problem appears to be that the initial cost of retrofit fluorescent lamps is too high and the non-incandescent lamps, although they may last for several thousand hours, will eventually dim and fail, requiring replacement. What is needed is a different type of alternative lamp for retrofitting incandescent lamps that can be made and marketed at a substantially lower cost than conventional retrofit fluorescent lamps, and which will provide greater efficiency and longer life.

Light emitting diodes (LEDs) have recently been developed that produce white light at a substantially greater intensity than earlier LEDs of this type. In the prior art, U.S. Pat. No. 5,463,280 (Johnson) discloses an LED retrofit lamp for use in replacing incandescent lamps employed in EXIT signs and the like. Instead of requiring up to 20 watts of a conventional incandescent light bulb used in an EXII sign, this retrofit LED lamp produces about the same output level of light, only consumes about two watts of power, and can operate for at least 25 years. As described in this patent, a plurality of LEDs emitting red light (peak wavelength of 650–670 nm) are mounted on elongate printed circuit (PC) boards in a linear, spaced-apart array. The PC boards include conductors that electrically connect the LEDs in series. Two such PC boards are stacked back-to-back and connected to an alternating current (AC) line power source through a current limiting circuit. In one embodiment, the current limiting circuit includes a capacitor connected in series between the AC line and a rectifier. In another embodiment, a resistor is used to limit the current to a rectifier and through the series-connected LEDs. In still another embodiment, a switching power supply provides current to the LEDs. While the invention disclosed in this reference may be suitable for its disclosed intended use, it is not suitable for providing general ambient or task lighting, because the light emitted by the LEDs is red in color and is not uniformly distributed around the elongate glass tube in which the PC boards and current limiting power supply are housed. Instead, the light is concentrated at diametrically opposite sides of the back-to-back PC boards, which is acceptable in an exit sign that is only visible from opposite sides. Also, if any LED should fail in the series-connected string disclosed in this prior art patent by becoming open-circuited, the failure will likely cause the entire string of LEDs to stop producing light. Clearly, this prior art device is not acceptable as a retrofit for incandescent bulbs used for general ambient room and task lighting. A more suitable solution is required if LED light sources are to be usable as replacements for incandescent bulbs in general ambient and task light applications.

SUMMARY OF THE INVENTION

In accord with the present invention, a lamp is defined for use in a conventional line current powered incandescent lamp socket, for providing area or task lighting. The lamp includes a base that is adapted to electrically and mechanically engage a conventional lamp socket and thus, to receive an alternating current (AC) via electrical terminals disposed on the base. A power supply is electrically connected to the electrical terminals on the base and receives the AC at a line voltage. The power supply limits a voltage and a magnitude of an electrical current produced at an output of the power supply. A flexible substrate on which a plurality of electrical conductors is disposed is included within the lamp. The flexible substrate is formed to generally define a cylinder that has one end disposed adjacent to the base. The plurality of electrical conductors are electrically connected to the output of the power supply. A plurality of solid-state light sources are mounted on an outer surface of the flexible substrate in a spaced-apart array, so that light emitted by the solid-state light sources when they are electrically energized is distributed radially about an entire circumference of the lamp. Each of the solid-state light sources is electrically connected to the plurality of electrical conductors disposed on the flexible substrate, so that the light sources are energized by the electrical current from the power supply. A generally cylindrical light transmissive envelope having an end attached to the base encloses the flexible substrate and the plurality of solid-state light sources. This light transmissive envelope protects the plurality of solid-state light sources, while transmitting the light that they emit.

Preferably, the plurality of solid-state light sources comprise light emitting diodes that emit a white light, although it is also contemplated that other types of solid-state light sources can instead be used.

The plurality of conductors disposed on the flexible substrate are preferably configured to electrically couple at least a portion of the plurality of solid-state light sources in parallel. In at least one preferred form of the invention, the power supply includes a transformer, and can also include a rectifier. The power supply is preferably disposed inside the base of the lamp.

Either a conductive adhesive or solder can be used to mount the plurality of solid-state light sources on the flexible substrate. In one embodiment, the plurality of solid-state light sources each include at least one terminal that is coupled to at least one of the plurality of conductors on the flexible substrate by a conductive lead.

A cylindrical support is employed for the flexible substrate in one embodiment, and the flexible substrate comprises an elongate thread on which the plurality of solid-state light sources are mounted in a linearly spaced-apart array. The elongate thread is helically wound around an outer surface of the cylindrical support, with the plurality of solid-state light sources disposed so as to emit light radially outward relative to a central axis of the cylindrical support.

For use in retrofitting a conventional three-way light bulb, the base includes three electrical terminals that are adapted to electrically connect with corresponding terminals of a three-way incandescent lamp socket. The three electrical terminals of the base are connected to corresponding different input terminals of the power supply. In this embodiment, the plurality of solid-state light sources are divided into at least two portions, and the power supply responds to application of an AC line voltage to specific input terminals to selectively energize the portions of the plurality of solid-state light sources, thereby varying a light intensity produced by the lamp as a function of the input terminals of the power supply that are energized with the AC line voltage.

The flexible substrate, or cylindrical support, preferably also includes an outer end on which a plurality of the solid-state light sources are also mounted in a spaced-apart array.

BRIEF DESCRIPTION OF THE DRAWING FIGURES

The foregoing aspects and many of the attendant advantages of this invention will become more readily appreciated as the same becomes better understood by reference to the following detailed description, when taken in conjunction with the accompanying drawings, wherein:

FIG. 6 is an elevational view of a conventional table lamp for a three-way incandescent bulb that has been retrofitted with a three-way lamp configured in accord with the present invention;

FIG. 7 is a bottom view of the three-way lamp shown in FIG. 6;

FIG. 8 is a view of the base of the three-way lamp shown in FIGS. 6 and 7, illustrating the leads connected to the terminals on the base;

FIG. 9 is a schematic block diagram illustrating a simple power supply for the three-way lamp of FIG. 6;

FIG. 12 is an enlarged isometric view of a portion of a solid-state light array mounted on the flexible substrate strand shown in FIG. 4;

FIG. 13 is an isometric view of a portion of a different embodiment of a solid-state array on a flexible substrate strand; and FIG. 14 is an enlarged cross-sectional view of the flexible substrate strand shown in FIG. 13.

DESCRIPTION OF THE PREFERRED EMBODIMENTS

Figure 2:
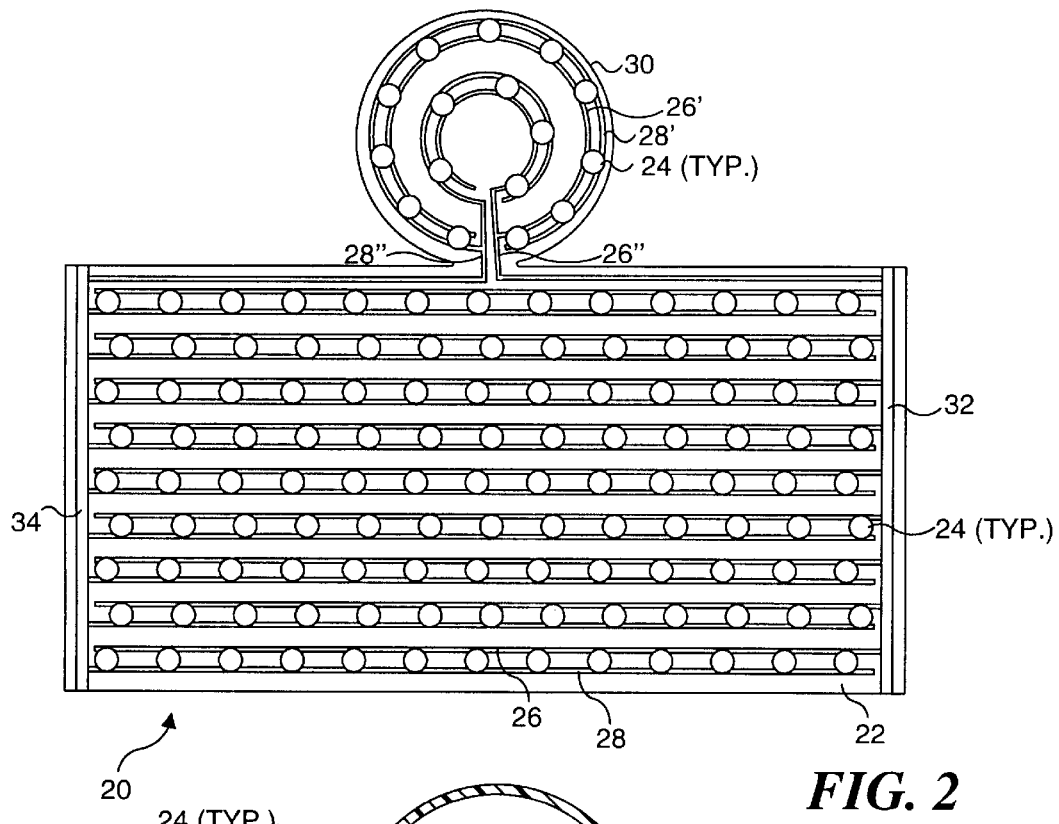
FIG. 2 is a flexible substrate and a plurality of solid-state light sources for use in the lamp of FIG. 1.
Figure 1:
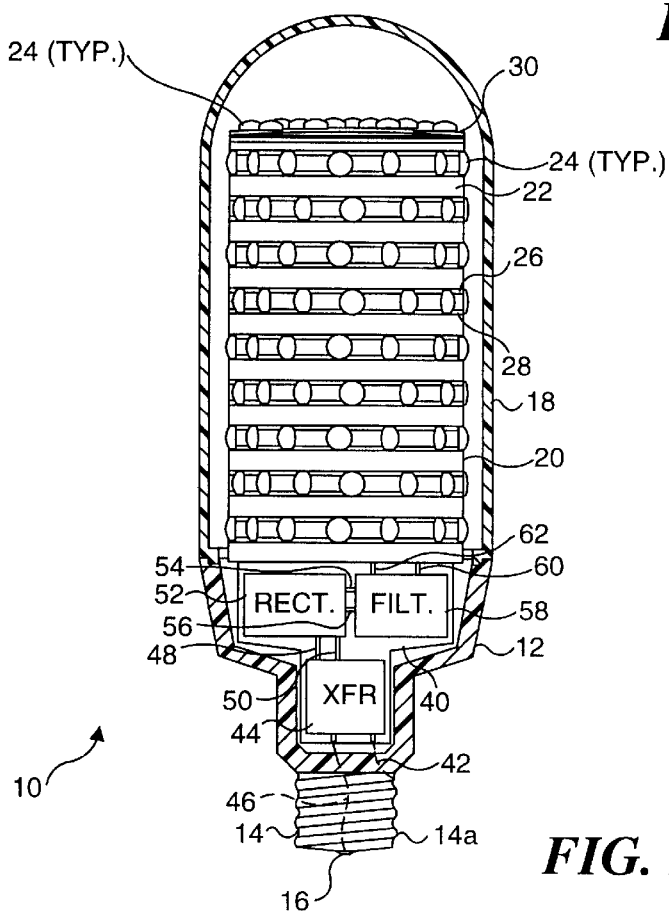
FIG. 1 is a cross-sectional view of a first embodiment of a lamp in accord with the present invention.

FIGS. 1 and 2 show details of a first embodiment of a lamp in accord with the present invention, which is designed for use in a conventional AC light socket, for example, to replace or retrofit a conventional incandescent bulb. In terms of its external appearance, a lamp 10, which is shown in the cutaway view of FIG. 1, may appear similar to fluorescent lamps that are designed for use in incandescent lamp sockets. However, unlike fluorescent lamps, the present invention does not use a fluorescent tube as a light source. Furthermore, it has a substantially longer expected life than such fluorescent lamps do and a much, much longer expected lifetime than a conventional incandescent lamp. It should also use substantially less power than even fluorescent lamp assemblies of equivalent light output.

Lamp 10 includes an injection molded plastic base 12 fabricated from an appropriate plastic material, with a hollow interior. Attached to the smallest diameter portion of base 12 is a threaded metallic terminal 14, on which are formed threads 14a that are sized and configured to mate with corresponding threads provided in a conventional lamp socket. Electrically isolated from the metallic threads by an appropriate insulator (not shown in this view) is a center terminal 16, formed in the center of the end of base 12, and disposed so as to contact a corresponding terminal in a conventional incandescent lamp socket.

A translucent, but generally light transmissive cylindrical cover 18 is attached to base 12. Cover 18 is formed as a cylinder having a curved, closed end opposite the end that attaches to base 12. Cover 18 is adhesively connected to base 12 or alternatively, is threaded into base 12, or connected thereto by an appropriate plurality of fasteners (not shown). Cover 18 encloses and protects a light source array 20 that is disposed inside the cover.

Light source array 20 includes a flexible substrate 22 that is initially fabricated in the form of the rectangular panel shown in FIG. 2, but the panel is then wrapped into a cylindrical shape, as shown in FIG. 1. Light source array 20 includes a plurality of spaced-apart solid-state light sources 24, which preferably comprise LEDs. However, it is also contemplated that other solid-state light emitting sources can also be used in place of LEDs, such as laser diodes. Each of the light emitting sources are mounted in electrical contact with pairs of generally parallel extending (i.e., on the flat panel) conductive traces 26 and 28 that extend around the cylindrical shape when light source array 20 is formed into the cylinder for use in lamp 10. Connected to the upper edge of flexible substrate 22 is a generally circular flap 30 of the flexible substrate material. Conductive traces 26' and 28' extend in generally concentric circles on flap 30 and are connected through conductive traces 26" and 28" to conductive traces 26 and 28. Additional light emitting sources 24 are also connected to conductive traces 26' and 28', as shown in FIG. 2.

Flexible substrate 22 is fabricated from an extremely flexible plastic material and is relatively thin to insure that it is sufficiently flexible to be formed into the cylindrical shape shown in FIG. 1 and to enable flap 30 to be folded downwardly to close the end of the cylindrical shape. When energized, light emitting sources 24 produce a substantially white light in the preferred embodiment, and this light is directed radially outward from a central axis of the cylindrical shape of light source array 20, through cover 18. Because cover 18 is preferably translucent or internally frosted, the light emitted from the lamp is diffuse and does not appear to be emitted from discrete light emitting sources 24. Cover 18 is preferably made from a plastic material, but may alternatively be made of glass that is preferably "frosted" on the interior, or another type of translucent ceramic material can also be used instead of plastic or glass.

An electrical current at an appropriate voltage and current level is supplied to conductive traces 26 and 28, and 26' and 28' from a power supply board 40, which is disposed within base 12. Each conductive trace 26/26' is electrically connected to a vertically extending conductive trace 32, and each conductive trace 28/28' is electrically connected to a vertically extending conductive trace 34. Vertically extending conductive traces 32 and 34 are disposed at opposite ends of flexible substrate 22, as shown in FIG. 2. The ends of flexible substrate 22 adjacent to the vertically extending conductive traces are adhesively joined together using a strip of adhesive tape or other appropriate adhesive, care being taken to prevent vertically extending conductive traces 32 and 34 from contacting each other and electrically shorting.

In the embodiment shown in FIG. 1, power supply circuit board 40 includes a transformer 44, a full-wave rectifier 52, and a filter 58. Transformer 44 is connected to threaded terminal 14 through a lead 42 that extends within the base, and to center terminal 16 through a lead 46, which also extends through the interior of base 12. The transformer receives an AC line voltage input from threaded terminal 14 and center terminal 16, producing a substantially lower output voltage that is conveyed through conductive traces 48 and 50 on power supply circuit board 40 and input to full-wave rectifier 52. The full-wave rectifier converts the lower AC voltage applied to its input to a full-wave rectified DC output that is input to filter 58 through conductive traces 54 and 56. Filter 58 smoothes the filtered DC that is input to it, producing a DC signal of the appropriate voltage, e.g., 3–5 volts, and with sufficient current to energize each of the plurality of light emitting sources 24 used within lamp 10, i.e., from about 5 ma to about 30 ma of current/lamp. Since in this embodiment, the light emitting sources are generally all connected in parallel to conductive traces 26 and 28, and 26' and 28', each of the light sources receives substantially the same voltage, and the required current will depend upon the number of LEDs used in the array. Since only a few milliamps of current at a relatively low voltage are required for each light emitting source, the total power requirement for lamp 10 is relatively low, yet it produces a light output equivalent to a substantially higher-power rated incandescent bulb. For example, it is estimated that a lamp in accord with the present invention, having 72 LEDs producing white light at an intensity approximately equal to that of a conventional 60 watt incandescent bulb, would only consume from about 8 watts to about 10 watts of power.

It should be noted that if LEDs are used for light emitting sources in lamp 10, rectifier 52 is not essential, since the LEDs themselves function as a rectifier, enabling current to flow in only one direction through the device when producing light. However, if rectifier 52 is omitted, the LEDs will only be energized during half of the power cycle, which will substantially reduce the total light output of lamp 10.

Figure 3:
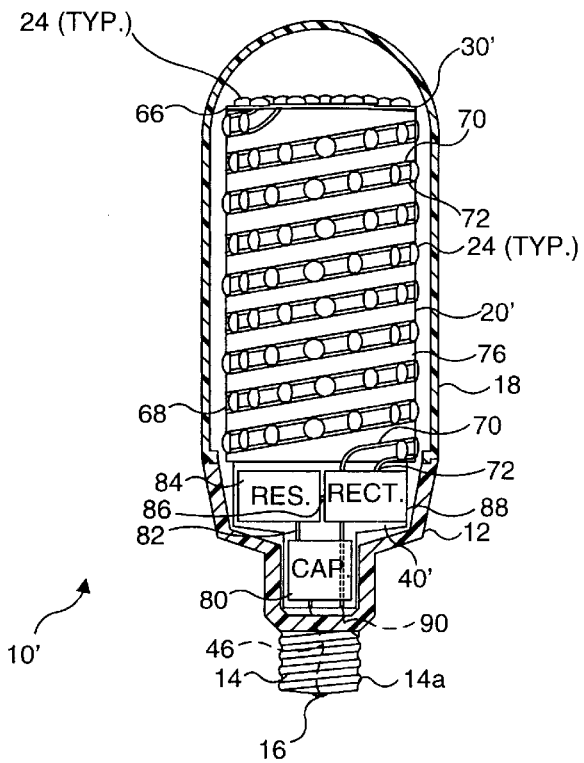
FIG. 3 is a cross-sectional view of a second embodiment of a lamp that includes a flexible substrate strand on which are mounted a plurality of solid-state light sources.
Figure 4:
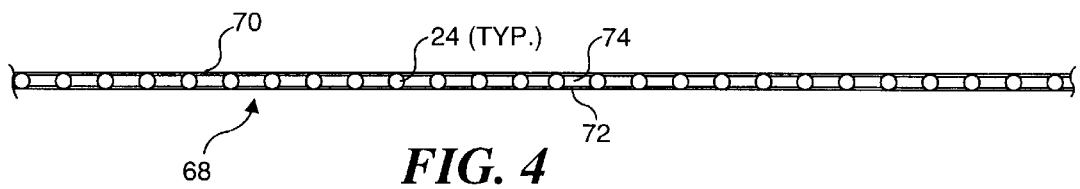
FIG. 4 is a section of the flexible substrate strand that is helically coiled around a support in the embodiment of FIG. 3.
Figure 5:
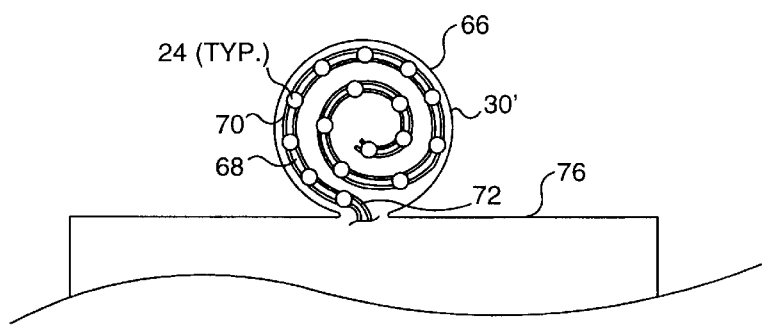
FIG. 5 is an elevational view showing a top portion of the support of FIG. 4 on which the flexible substrate strand extends in a helical coil.

Turning now to FIG. 3, a lamp 10' that is configured somewhat differently than lamp 10 is illustrated. Although appearing virtually identical from the outside, lamp 10' does not employ a cylindrically-shaped flexible substrate like that illustrated in FIGS. 1 and 2. In lamp 10', a flexible substrate strand 68, a portion of which is shown in FIG. 4, is employed. Flexible substrate strand 68 comprises substantially the same type of material as flexible substrate 22, but instead of being formed as a sheet on which a plurality of the light emitting sources are disposed in spaced-apart array in two dimensions, flexible substrate strand 68 is formed in an elongate shape having a width about equal to that of each light emitting source 24, and a substantially longer length. Conductive traces 70 and 72 extend generally parallel to each other along opposite sides of the top surface of a flexible substrate 74 (in FIG. 4) comprising flexible substrate strand 68. Light emitting sources 24 are then electrically and mechanically mounted to conductive traces 70 and 72 so that the light emitting sources are energized by an electrical current conveyed thereby. In lamp 10', a cylinder 76 fabricated of plastic, phenolic resin, or other lightweight preferably electrically insulating material provides a support for flexible substrate strand 68, which is wrapped around cylindrical support 76 in a helical spiral. As shown in FIG. 5, cylindrical support 76 is attached to a circular disk 66 forming an end 30' for the cylindrically-shaped support, which closes one end thereof and supports the light emitting sources at that end so that the light that they produce is directed through the end of cover 18.

In lamp 10', a power supply board 40' uses different components to provide the electrical current required to energize each of light emitting sources 24 that are mounted on flexible substrate strand 68. In power supply board 40', a capacitor 80 couples the voltage supplied from center terminal 16 through lead 46, to a limiting resistor 84, which is connected to the capacitor through a conductive trace 82. Thus, capacitor 80 and resistor 84 couple and limit AC current from the AC line source that is applied to a full-wave rectifier 88, which is connected to the threaded terminal through a conductor 90. Full-wave rectifier 88 converts the AC input to it into a direct current, which is supplied through conductive traces 70 and 72 to flexible substrate strand 68 to energize light emitting sources 24.

It is also contemplated that a lamp in accord with the present invention may be used in a conventional three-way light socket of the type in which a switch having four positions (off, low light output level, medium light output level, and full light output level) is used to selectively control the brightness of the light produced by a conventional three-way incandescent bulb. In a conventional three-way incandescent bulb, two filaments are provided and typically rated for different wattage, for example, 50 watts and 75 watts. In this example, when the switch on a conventional three-way light socket is rotated from its off position to the low light output level position, only the 50 watt filament is energized. Upon rotating the switch to the next position, the 50 watt filament is de-energized, and only the 75 watt filament is energized. Finally, when the switch is rotated to the position for full light output level, both the 50 watt and 75 watt filaments are energized. The next rotation of the switch de-energizes both filaments in the light bulb.

A lamp 96, which is constructed in accord with the present invention, can be used in a conventional three-way lamp socket in place of or as a retrofit for a conventional incandescent three-way light bulb. In FIG. 6, lamp 96 is shown in use in a conventional three-way light fixture 100 having a lamp base 102 with a three-way light socket 104 and a four-position switch 106. AC power is supplied to three-way socket 104 through an AC line cord 108. As is true of a conventional incandescent three-way light, lamp 96 includes threaded terminal 14 with threads 14a and center terminal 16, but also includes an annular terminal 112 around center terminal 16. Center terminal 16, annular terminal 112, and threaded terminal 14 are separated electrically from each other by insulating material 110.

FIGS. 7 and 8 illustrate details of the central, annular, and threaded terminals used on lamp 96. As shown in FIGS. 8 and 9, a conductor 114 connects annular terminal 112 to a node 132 within a power supply 120, while conductor 46 connects center terminal 16 to a node 134 and a conductor 116 connects the threaded terminal or neutral of the AC line to a node 136 in the power supply, which is grounded, i.e., is connected to the neutral side of the AC line. Node 132 is connected through a resistor 128 that limits current to each of the light emitting sources within a light string 68' mounted on a flexible substrate strand 122. A resistor 130 limits the current from node 134 that is supplied to a light string 68", which is mounted on a different flexible substrate strand (not separately shown in this Figure, but generally similar to flexible substrate strand 122). Light strings A and B, which are identified by reference numbers 68' and 68", respectively, generally correspond in function to the two filaments used in a conventional three-way incandescent light bulb. It should be noted that power supply 120 is substantially simpler than the power supplies previously illustrated. However, it is also contemplated that transformers, rectifiers, and filters can be used with this embodiment, or alternatively, a coupling capacitor and a rectifier can be added to the power supply shown in FIG. 120. Further, light string A and light string B may include different numbers of light emitting sources so that a different light output is produced by each of the two light strings.

As a further alternative, a power supply can be provided that includes a triac so that a single light string can be employed instead of two light strings. The light output of the single light string can then be controlled with an electronic switch that is activated by the power provided through the annular terminal and/or center terminal, to control the voltage and/or current supplied to the light emitting sources in the single light string. These light emitting sources in the single light string will then be controlled to emit a relatively low light level in the low light position of the three-way switch, a medium light level in the next position, and the full output light level in the third position of the switch.

Figure 10:
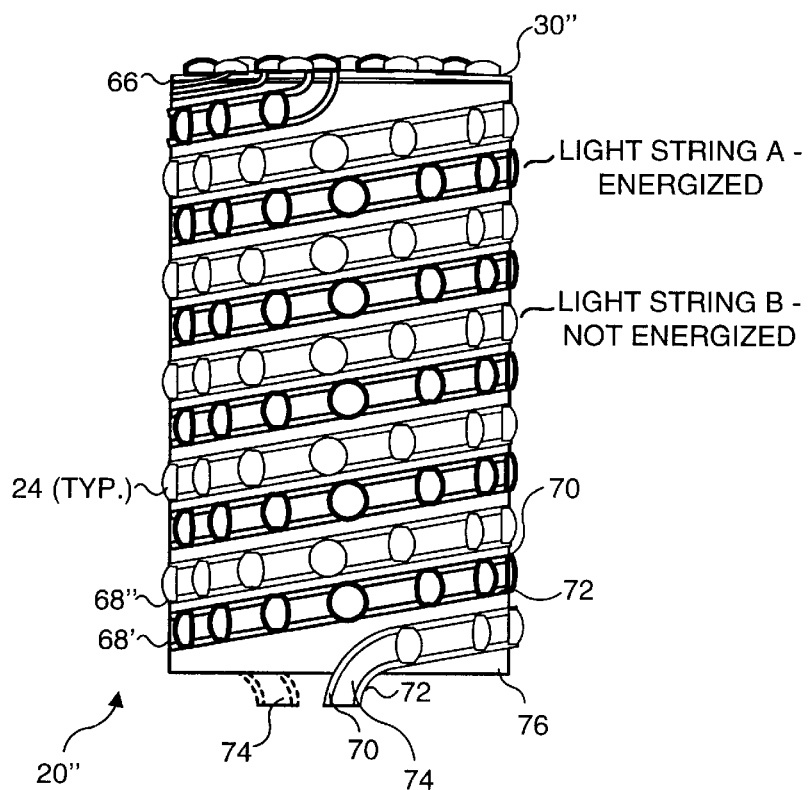
FIG. 10 is an elevational view of a solid-state light array formed by wrapping a double helix of the flexible substrate strands shown in FIG. 4 around a central cylindrical support.
Figure 11:
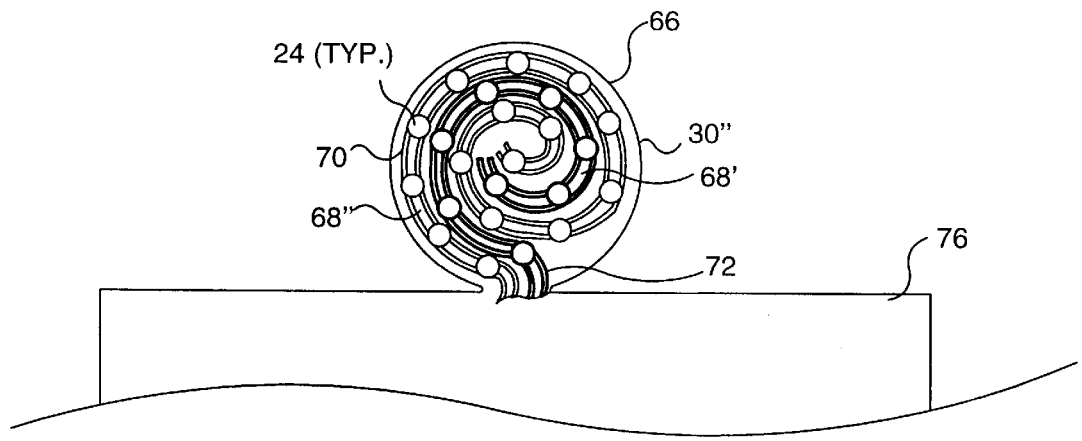
FIG. 11 is an elevational view showing a top portion of the support of FIG. 10 on which the flexible substrate strands extend in double helical coils.

A light source array 20" for use in lamp 96 is illustrated in FIG. 10. As shown therein, flexible light strands 68' and 68" are wrapped in a double helix around cylindrical support 76. In this Figure, only the light emitting sources on flexible substrate strand 68' are energized. To indicate their energized state, they are represented with a bolder line, indicating that they are emitting light, while the light emitting sources on flexible substrate strand 68" (corresponding to light string B) have not yet been energized and are represented with lighter drawn lines. Light source array 20" includes a top 30", details of which are shown in FIG. 11. Flexible substrate strands 68' and 68" spiral inwardly on the top or outer surface of end 30", and the light they produce is directed through the end of cover 18 for lamp 96 (shown in FIG. 6) when one or both of the light strings are energized.

FIG. 12 illustrates details of a first embodiment for producing flexible strand 68 (or 68' or 68") in which flexible substrate 74 includes flexible conductive traces 70 and 72 extending generally parallel along the opposite edges of one surface. At spaced-apart intervals along the surface, LEDs 142 are connected to the flexible conductive traces. A terminal 146 on each LED is electrically connected to flexible conductive trace 72 using a large drop 144 of a conductive adhesive or solder. Similarly, a large drop 140 of conductive adhesive or solder connects an opposite terminal (not shown) on LED 142 to conductive trace 70.

FIGS. 13 and 14 illustrate a flexible substrate strand 150 that includes a thread 152 formed of the flexible substrate having flexible conductive traces 156 and 158 extending along opposite edges. A plurality of LEDs or other solid-state light emitting devices are mounted on the top surface of thread 152 using an adhesive. A terminal 164 on one side of each LED or light emitting source is connected through a flywire 162. One end of the flywire is ultrasonically or thermosonically welded to the terminal and the other end of the flywire is ultrasonically or thermosonically welded at point 160 on conductive trace 156. Similarly, on the opposite side of the solid-state light emitting source, a terminal 170 is connected through a flywire 166 or other conductive metal strip to conductive trace 156. Flywire 166 is ultrasonically or thermosonically welded to terminal 170 and to point 168 on the conductive trace at each LED. Flexible substrate strand 150 is somewhat thinner in width than the embodiment shown in FIG. 12, and is simply a further example of how the flexible substrate strands can be configured for use in the present invention. It will be understood by those of ordinary skill in the art that other embodiments of a flexible substrate strand or thread that includes conductive traces on which the light emitting sources are mounted in spaced-apart linear array can be used within the lamps in accord with the present invention. It should also be noted that other shapes and configurations of lamps that use a flexible substrate on which light emitting sources are mounted either in a two-dimensional array or in a linear array can be employed and that the base can be configured to provide an electrical connection to other types of sockets.

Although the present invention has been described in connection with the preferred forms of practicing it and modifications thereto, those of ordinary skill in the art will understand that many other modifications can be made thereto within the scope of the claims that follow. Accordingly, it is not intended that the scope of the invention in any way be limited by the above description, but instead be determined entirely by reference to the claims that follow.

What is claimed is:

1. A lamp for use in a conventional line current powered incandescent lamp socket, for providing area or task lighting, comprising:
   (a) a base that is adapted to electrically and mechanically engage a conventional line current powered incandescent lamp socket, to receive an alternating current (AC) via electrical terminals disposed on the base;
   (b) a power supply electrically connected to the electrical terminals on the base, said power supply receiving the AC and providing an output electrical current;

(c) a flexible substrate strand on which are disposed a plurality of electrical conductors, said flexible substrate strand having one end disposed adjacent to the base, said plurality of electrical conductors being electrically connected to the output of the power supply;

(d) a plurality of solid-state light sources mounted on an outer surface of the flexible substrate strand in a spaced-apart array that is configured so that light emitted by the plurality of solid-state light sources when they are electrically energized by the electrical current radiates outwardly about an entire circumference of the lamp, each of said plurality of solid-state light sources being electrically connected to the plurality of electrical conductors disposed on the flexible substrate strand, enabling the plurality of solid-state light sources to be energized by the electrical current produced by the power supply; and (e) a light transmissive envelope having an end attached to the base, said envelope enclosing the flexible substrate strand and the plurality of solid-state light sources, providing protection to the plurality of solid-state light sources, while transmitting the light emitted by the plurality of solid-state light sources generally radially outward from the lamp.

2. The lamp of claim 1, wherein the plurality of solid-state light sources comprise light emitting diodes that emit a white light.

3. The lamp of claim 1, wherein the plurality of conductors disposed on the flexible substrate strand are configured to electrically couple at least a portion of the plurality of solid-state light sources in parallel with each other.

4. The lamp of claim 1, wherein the plurality of conductors disposed on the flexible substrate strand extend substantially in alignment with each other along a surface of the flexible substrate strand.

5. The lamp of claim 1, wherein the power supply comprises a transformer.

6. The lamp of claim 1, wherein the power supply includes a rectifier.

7. The lamp of claim 1, wherein the plurality of solid-state light sources are mounted on the flexible substrate strand with one of a conductive adhesive and solder.

8. The lamp of claim 1, wherein the plurality of solid-state light sources each include at least one terminal that is coupled to at least one of the plurality of conductors on the flexible substrate strand by a conductive lead.

9. The lamp of claim 1, further comprising a cylindrical support for the flexible substrate strand, said flexible substrate strand being helically wound around an outer surface of the cylindrical support.

10. The lamp of claim 1, wherein the base includes three electrical terminals that are adapted to electrically connect with corresponding terminals of a three-way incandescent lamp socket, at least two of said three electrical terminals of the base being connected to the power supply, said power supply responding to application of an AC line voltage to specific ones of the electrical terminals to provide an electrical current to energize a predetermined portion of the plurality of solid-state light sources, thereby varying a light intensity produced by the plurality of solid-state light sources as a function of the electrical terminals that are energized with the AC line voltage.

11. The lamp of claim 9, wherein the cylindrical support includes an end portion opposite the base, a portion of said flexible substrate strand being disposed on said end portion, such that said end portion also includes a plurality of the solid-state light sources disposed thereon in a spaced-apart array.

12. The lamp of claim 1, wherein the power supply is disposed within the base.

13. The lamp of claim 1, wherein the light transmissive envelope is generally cylindrical.

14. The lamp of claim 9, wherein the cylindrical support for the flexible substrate strand comprises at least one of a plastic material and a phenolic resin material.

15. The lamp of claim 9, wherein the cylindrical support for the flexible substrate strand comprises an electrically insulating material.

16. A lamp adapted to replace an incandescent lamp in a conventional line voltage alternating current (AC) lamp socket, comprising:

(a) a base having male threads and sized so that it is adapted to be threaded into a conventional line voltage AC lamp socket, said base including electrical terminals adapted to contact corresponding electrical terminals in a conventional line voltage AC lamp socket;

(b) a flexible substrate that is formed so as to generally define a cylinder and which includes a plurality of conductive traces disposed thereon, said flexible substrate comprising an end section being disposed over and generally closing an end of the cylinder;

(c) a first plurality of solid-state light sources disposed on an outer surface of the flexible substrate in a spaced-apart array, and a second plurality of solid-state light sources disposed on an outer surface of said end section, each of said first and second plurality of solid-state light sources being connected to the plurality of conductive traces, and when energized by an electrical current, each first solid-state light source emitting substantially white light that is directed outwardly away from the flexible substrate and radially outwardly from the lamp, and each second solid-state light source emitting substantially white light that is directed outwardly away from the end section;

(d) a power supply disposed in the base and electrically connected to the terminals to enable the power supply to receive input current therefrom, said power supply being connected to the conductive traces on the flexible substrate and when supplied with a line voltage AC, producing an electrical current at a voltage sufficient to energize the first and second pluralities of solid-state light sources; and (e) a light transmissive cover sized and shaped to enclose and protect the plurality of solid-state light sources mounted on the flexible substrate, the light emitted by the plurality of solid-state light sources being transmitted through the cover.

17. The lamp of claim 16, wherein the power supply limits at least one of the electrical current and the voltage applied to energize the first and second pluralities of solid-state light sources to magnitudes that do not damage the first and second pluralities of solid-state light sources.

18. The lamp of claim 16, therein the first and second pluralities of solid-state light sources are connected in parallel to the power supply via the plurality of conductive traces.

19. The lamp of claim 16, wherein the light transmissive cover is generally cylindrical.

20. The lamp of claim 16, wherein the terminals include a center terminal, an annular terminal, and a threaded terminal, said center terminal and said annular terminal being adapted to electrically connect with corresponding terminals in a three-way lamp socket that includes a four-position switch, when the threaded terminal of the lamp is mated with a three-way lamp socket.

21. The lamp of claim 20, wherein the power supply energizes a different portion of at least one of the first and second pluralities of solid-state light sources as a function of whether an AC line voltage is applied to the threaded terminal and:
  (a) the center terminal; and/or
  (b) the annular terminal.

22. The lamp of claim 16, wherein the cover is formed of one of a glass and a plastic material.

23. The lamp of claim 16, wherein the cover diffuses the white light emitted by the first and second pluralities of solid-state light sources.

24. The lamp of claim 16, wherein each of the solid-state light sources comprises a light emitting diode.

25. A lamp for use in a conventional line current powered incandescent lamp socket, for providing area or task lighting, comprising:
  (a) a base that is adapted to electrically and mechanically engage a conventional line current powered incandescent lamp socket, to receive an alternating current (AC) via electrical terminals disposed on the base, said base including three electrical terminals that are adapted to electrically connect at least two of said three electrical terminals of the base with corresponding terminals of a three-way incandescent lamp socket;
  (b) a power supply electrically connected to at least two of said three electrical terminals of the base, said power supply receiving the AC and providing an output electrical current;
  (c) a flexible substrate on which are disposed a plurality of electrical conductors, said flexible substrate being formed to generally define a cylindrical shape and having one end disposed adjacent to the base, said plurality of electrical conductors being electrically connected to the output of the power supply;
  (d) a plurality of solid-state light sources mounted on an outer surface of the flexible substrate in a spaced-apart array that is configured so that light emitted by the plurality of solid-state light sources when they are electrically energized by the electrical current radiates outwardly about a circumference of the lamp, each of said plurality of solid-state light sources being electrically connected to the plurality of electrical conductors disposed on the flexible substrate, enabling the plurality of solid-state light sources to be energized by the electrical current produced by the power supply, such that said power supply responds to application of an AC line voltage to specific ones of the electrical terminals to provide an electrical current to energize a predetermined portion of the plurality of solid-state light sources, thereby varying a light intensity produced by the plurality of solid-state light sources as a function of the electrical terminals that are energized with the AC line voltage; and
  (e) a generally cylindrical light transmissive envelope having an end attached to the base, said envelope enclosing the flexible substrate and the plurality of solid-state light sources, providing protection to the plurality of solid-state light sources, while transmitting the light emitted by the plurality of solid-state light sources generally radially outward from the lamp.

26. A lamp for use in a conventional line current powered incandescent lamp socket, for providing area or task lighting, comprising:
  (a) a base that is adapted to electrically and mechanically engage a conventional line current powered incandescent lamp socket, to receive an alternating current (AC) via electrical terminals disposed on the base;
  (b) a power supply electrically connected to the electrical terminals on the base, said power supply receiving the AC providing an output electrical current;
  (c) a flexible substrate on which are disposed a plurality of electrical conductors, said flexible substrate being formed to generally define a cylindrical shape and having a first end disposed adjacent to the base, and a second end opposite said first end, said plurality of electrical conductors being electrically connected to the output of the power supply;
  (d) a plurality of solid-state light sources mounted on an outer surface of the flexible substrate, and on an outer surface of said second end, said plurality of solid-state light sources being configured in a spaced-apart array that enables light emitted by the plurality of solid-state light sources, when they are electrically energized by the electrical current, to radiate outwardly about an entire circumference of the lamp and outwardly from said second end, each of said plurality of solid-state light sources being electrically connected to the plurality of electrical conductors disposed on the flexible substrate, enabling the plurality of solid-state light sources to be energized by the electrical current produced by the power supply; and
  (e) a generally cylindrical light transmissive envelope having an end attached to the base, said envelope enclosing the flexible substrate and the plurality of solid-state light sources, providing protection to the plurality of solid-state light sources, while transmitting the light emitted by the plurality of solid-state light sources generally outward from the lamp.

27. A lamp adapted to replace an incandescent lamp in a conventional line voltage alternating current (AC) lamp socket, comprising:
  (a) a base having male threads and sized so that it is adapted to be threaded into a conventional line voltage AC lamp socket, said base including electrical terminals adapted to contact corresponding electrical terminals in a conventional line voltage AC lamp socket;
  (b) a flexible substrate that is formed so as to generally define a cylinder, said flexible substrate including an end section disposed over and generally closing an end of the cylinder, said flexible substrate including a plurality of conductive traces disposed thereon;
  (c) a plurality of solid-state light sources disposed on an outer surface of the flexible substrate, including an outer surface of said end section, in a spaced-apart array, each of said plurality of solid-state light sources being connected to the plurality of conductive traces, and when energized by an electrical current, emitting substantially white light that is directed outwardly away from the flexible substrate, both radially outwardly from the lamp, and away from the end section of the flexible substrate;
  (d) a power supply disposed in the base and electrically connected to the terminals to enable the power supply to receive input current therefrom, said power supply being connected to the conductive traces on the flexible substrate and when supplied with a line voltage AC, producing an electrical current at a voltage sufficient to energize the plurality of solid-state light sources; and
  (e) a light transmissive cover sized and shaped to enclose and protect the plurality of solid-state light sources mounted on the flexible substrate, the light emitted by the plurality of solid-state light sources being transmitted through the cover.

28. A lamp adapted to replace an incandescent lamp in a conventional line voltage alternating current (AC) lamp socket, comprising:
  (a) a base having male threads and sized so that it is adapted to be threaded into a conventional line voltage AC lamp socket, said base including electrical terminals adapted to contact corresponding electrical terminals in a conventional line voltage AC lamp socket, said terminals including a center terminal, an annular terminal, and a terminal comprising the male threads, said center terminal and said annular terminal being adapted to electrically connect with corresponding terminals in a three-way lamp socket that includes a four-position switch, when the male threads of the lamp are mated with corresponding female threads of a three-way lamp socket;
  (b) a flexible substrate that is formed so as to generally define a cylinder and which includes a plurality of conductive traces disposed thereon;
  (c) a plurality of solid-state light sources disposed on an outer surface of the flexible substrate in a spaced-apart array, each of said plurality of solid-state light sources being connected to the plurality of conductive traces, and when energized by an electrical current, emitting substantially white light that is directed outwardly away from the flexible substrate and radially outwardly from the lamp;
  (d) a power supply disposed in the base and electrically connected to the terminals to enable the power supply to receive input current therefrom, said power supply being connected to the conductive traces on the flexible substrate and when supplied with a line voltage AC, producing an electrical current at a voltage sufficient to energize the plurality of solid-state light sources; and
  (e) a light transmissive cover sized and shaped to enclose and protect the plurality of solid-state light sources mounted on the flexible substrate, the light emitted by the plurality of solid-state light sources being transmitted through the cover.

29. The lamp of claim 28, wherein the power supply energizes a different portion of the plurality of solid-state light sources as a function of whether an AC line voltage is applied to the terminal coupled to the male threads, and to:
  (a) the center terminal; and/or
  (b) the annular terminal.

30. A lamp for use in a conventional line current powered incandescent lamp socket, for providing area or task lighting, comprising:
  (a) a base that is adapted to electrically and mechanically engage a conventional line current powered incandescent lamp socket, to receive an alternating current (AC) via electrical terminals disposed on the base;
  (b) a power supply electrically connected to the electrical terminals on the base, said power supply receiving the AC providing an output electrical current;
  (c) a flexible substrate being formed to generally define a cylindrical shape and having one end disposed adjacent to the base, said flexible substrate having an outer surface on which are disposed a plurality of electrical conductors, said plurality of electrical conductors being electrically connected to the output of the power supply;
  (d) a plurality of solid-state light sources mounted on said outer surface of the flexible substrate in a spaced-apart array that is configured so that light emitted by the plurality of solid-state light sources when they are electrically energized by the electrical current radiates outwardly about an entire circumference of the lamp, each of said plurality of solid-state light sources being electrically connected to the plurality of electrical conductors disposed on the flexible substrate, enabling the plurality of solid-state light sources to be energized by the electrical current produced by the power supply; said solid-state light sources being selected to produce visible light useful for at least one of task lighting and area lighting; and
  (e) a light transmissive envelope having an end attached to the base, said envelope enclosing the flexible substrate and the plurality of solid-state light sources, providing protection to the plurality of solid-state light sources, while transmitting the light emitted by the plurality of solid-state light sources generally outward from the lamp.

* * * * *